United States Patent [19]

Jensen

[11] 4,263,522
[45] Apr. 21, 1981

[54] BACKGROUND SUBTRACTOR USING CCD TECHNIQUES

[75] Inventor: William E. Jensen, San Pedro, Calif.

[73] Assignee: Hughes Aircraft Company, Culver City, Calif.

[21] Appl. No.: 972,134

[22] Filed: Dec. 21, 1978

[51] Int. Cl.³ .............................................. H03K 5/153
[52] U.S. Cl. ............................... 307/358; 307/221 D; 307/353; 328/162; 357/24
[58] Field of Search ................... 307/221 D, 237, 264, 307/238, 353, 358; 328/151, 162, 165; 357/24; 333/165

[56] References Cited

U.S. PATENT DOCUMENTS

| | | | |
|---|---|---|---|
| 3,876,952 | 4/1975 | Weimer | 328/151 |
| 4,071,775 | 1/1978 | Hewes | 307/221 D |
| 4,139,782 | 2/1979 | Ablassmeier | 307/221 D |

Primary Examiner—John Zazworsky
Attorney, Agent, or Firm—Lawrence V. Link, Jr.; W. H. MacAllister

[57] ABSTRACT

A CCD background subtractor having a first charge storage arrangement for detecting, during periodic sampling intervals, the peak value of an applied input signal, and a second charge storage arrangement into which charge representative of said peak value is periodically transferred and held. A third charge storage arrangement also receives the applied input signal and is controlled as a function of the charge held in the second charge storage arrangement such that the output signal from the third charge storage arrangement is representative of the difference between the applied input signal and the peak value thereof sampled during a prior sampling interval.

7 Claims, 10 Drawing Figures

BACKGROUND SUBTRACTOR USING CCD TECHNIQUES

BACKGROUND OF THE INVENTION

This invention is in the field of background signal subtractors using CCD principles.

In many applications it is desirable to delete the DC components of an applied signal, while passing AC signals which have encoded thereon the information to be processed. For example, in imaging systems the DC background signal comprises a large portion of the output signal from the imaging sensor while the useful imaging information is contained in the relatively small, high frequency, portion of the sensor's output signal. In such applications, economy and efficiency of signal processing may be realized by removing the background signal during an early stage of the signal processing operations.

Background subtractors in general are known in the art, such is for example, those which include AC couplers that make use of capacitors and the like. However, the prior art does not include CCD type background subtractors for transferring the AC portion of a signal which may contain DC components; and as compared to CCD devices, commonly used background subtractors are bulky, heavy and expensive. Also, conventional background subtractors or capacitors have the disadvantage of being limited to a fixed or predetermined transfer characteristics.

SUMMARY OF THE INVENTION

A major objective of this invention is to provide by means of charge coupled device background subtractors which reject DC (or low frequency) signal components present in an input signal while passing the AC (higher frequency) signal components.

Briefly, according to the invention, a background subtractor is mechanized by utilizing a semiconductor substrate with an overlying electrically insulating film, wherein diffusions are present in the substrate and gating electrodes are provided within the overlying insulating film.

Unlike the prior art, CCD background signal subtractors in accordance with the present invention have the desirable characteristics of a variable roll off frequency (the three decibel attenuation point of the subtractor's frequency response curve). Hence such CCD type of background subtractors may be more readily tailored to design parameters of the system in which they are used.

Background subtractor's in accordance with the present invention include a peak value detector and a sample and hold circuit. The peak value detector (first charge storage arrangement) consists of a diffusion in the substrate and several gates embedded in the overlying insulating layer together with the voltages applied to the respective diffusion and gates. Such peak value detection circuit feeds the sample and hold circuit (second charge storage arrangement) which consists of another diffusion element in the substrate and several gates in the insulating layer. The output of the sample and hold circuit provides a voltage to the non-inverting input gate within the insulating layer, wherein such gate voltage controls the amount of charge in a charge well directly below such gate.

The peak positive value of an applied input signal is detected within the peak value detector as the minimum charge level in a first charge well which is initially precharged by an externally connected power source. Potential barriers are provided on either side of the well, so that if the voltage input to the peak value detector is more positive than the initial input voltage to such peak detector, then one of the potential barriers will drop, and charge will drain out over such dropped barrier into an adjacent storage area. Draining of the well continues until the charge remaining in the well is at a potential equal to the potential of the dropped barrier.

The charge in said first storage well is transferred to, held and monitored by a diffusion in the substrate (second charge storage arrangement), which diffusion provides a reference voltage to a non-inverting input of a differential amplifying circuit (third charge storage arrangement).

In the third charge storage arrangement the reference voltage is fed to a gate electrode above a third storage well within the film. Also fed to the third charge storage arrangement is the applied input signal and the third charge storage arrangement responds thereto so as to produce an output signal which is indicative of the difference between the applied input signal and the reference voltage developed during a prior peak detector interval. The background subtractor thereby reduces DC and low frequency components present in the applied input signal.

DETAILED DESCRIPTION

Figure 1:
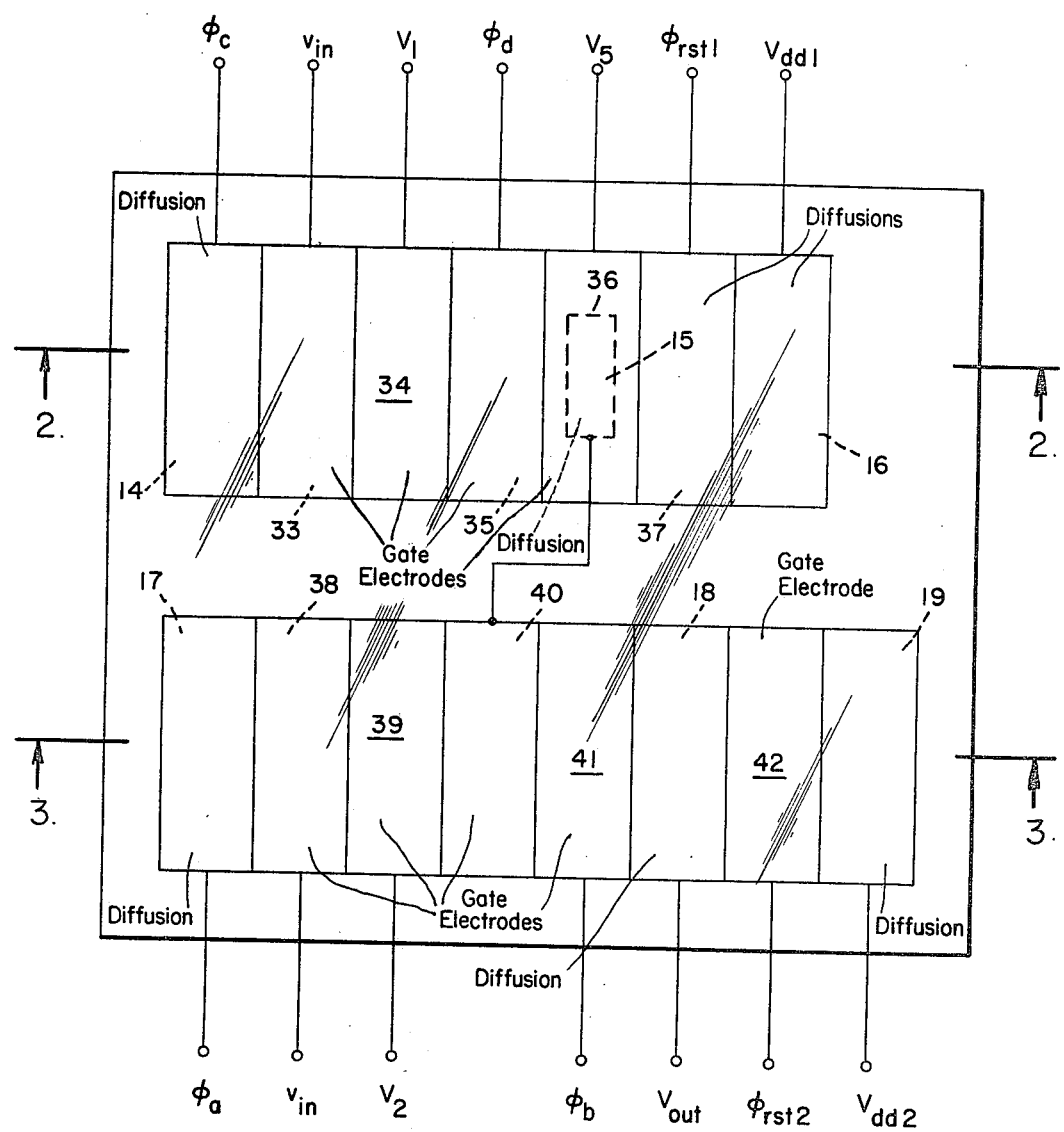
FIG. 1 is a plan view of a CCD device in accordance with the invention.
Figure 2:
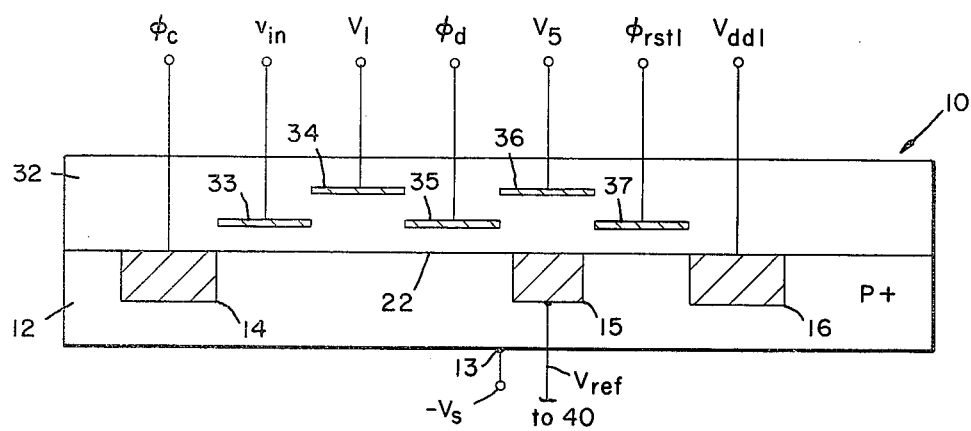
FIG. 2 is a cross-section view taken at plane 2—2 of FIG. 1 showing details of the device structure.
Figure 2A:
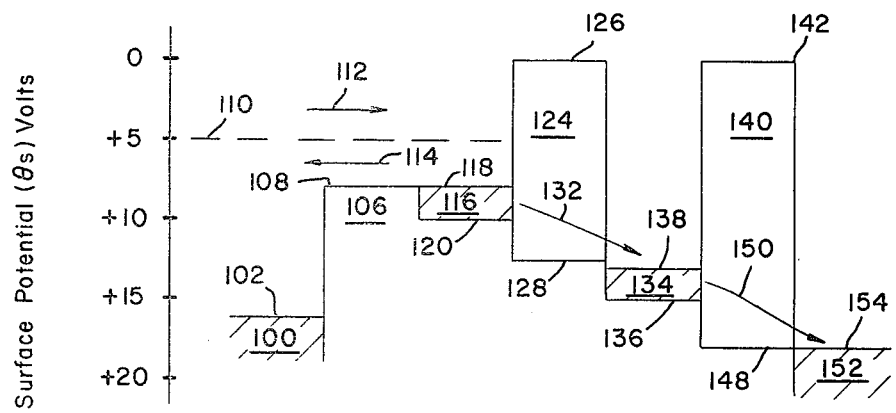
FIG. 2a is a potential profile diagram of the cross-section view portion of FIG. 2.
Figure 3:
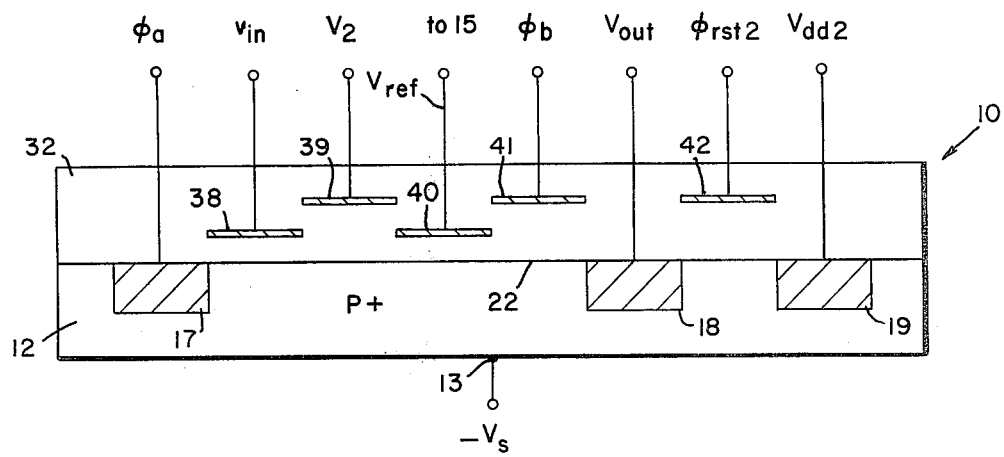
FIG. 3 is a cross-section view taken at plane 3—3 of FIG. 1 showing further structural details of the CCD device.
Figure 3A:
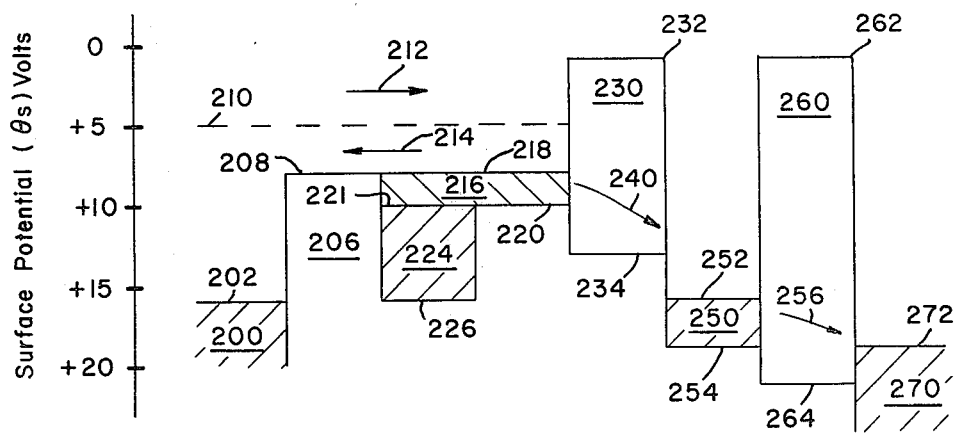
FIG. 3a is a potential profile diagram of the cross-section view portion of FIG. 3.
Figure 4:
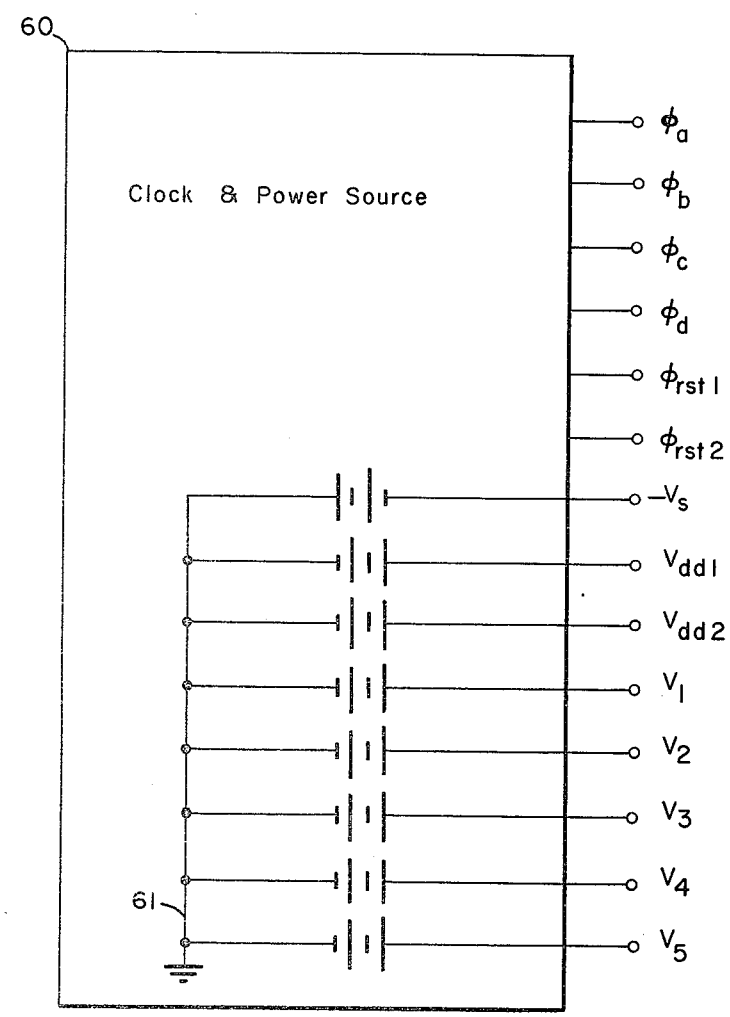
FIG. 4 is a block diagram showing the various DC and clock voltages fed to the CCD device.

Referring to FIGS. 1, 2, 2a, 3, 3a, 4, 5 and 5a a charge transfer (sometimes referred to as a charge coupled) device 10 is provided for subtracting out a background signal from an applied analog signal voltage $v_{in}$. A section of device 10, designated at 50 in FIG. 6 functions as a CCD input charge modulator of device 10.

Device 10 has a semiconductor body 12, generally of silicon, however other semiconductor materials such as germanium may be utilized as body 12. Body 12 is shown as a P+ conductivity doped silicon material, however it is understood that other conductivity type materials such as N types may be used.

Diffusion 16 is partially embedded within body 12 and is connected to and fed by DC voltage source 60

(FIG. 4) with respect to ground potential 61. One output from source 60 is designated $V_{dd1}$, and it gives rise to potential charge area 152 (FIG. 2a) with a surface potential ($\phi_s$) shown by level 154.

It should be noted that potential area 152 is not a charge well because charge cannot be stored thereat and such an area is essentially a charge drain or sink. This is also true for areas 100, 200 and 270 which are charge drains or sinks.

Conductor 13 is connected to substrate semiconductor body 12 which is interconnected to and fed by DC voltage $-V_s$ from power source 60, with the positive side of battery $V_s$ being a ground potential, thus providing a negative bias to substrate 12.

Diffusion 14 is partially embedded within body 12 and is interconnected to and fed by clock voltage source $\phi_c$ from power source 60. The clock waveform $\phi_c$ is indicated by waveform D in FIG. 5 and provides a periodice input charge source by alternating the levels of area 100 between surface potential levels 102 and 110.

Diffusion 15 is partially embedded within body 12 and provides analog voltage $V_{ref}$ to gate 40 in the form of waveform G.

Diffusion 17 is partially embedded within body 12 and is connected to and fed by clock voltage $\phi_a$ from power source 60. The clock waveform of $\phi_a$ is indicated by waveform B in FIG. 5 and provides a periodic input charge by alternating the levels of area 200 between surface potential levels 202 and 210.

An electrically insulating film 32 of $SiO_2$ is deposited over layer 12 and forms an interface 22 with layer 12 and the upper surfaces of each of diffusions 14, 15, 16, 17, 18 and 19. It is understood that other types of insulating films may be used.

Figure 5:
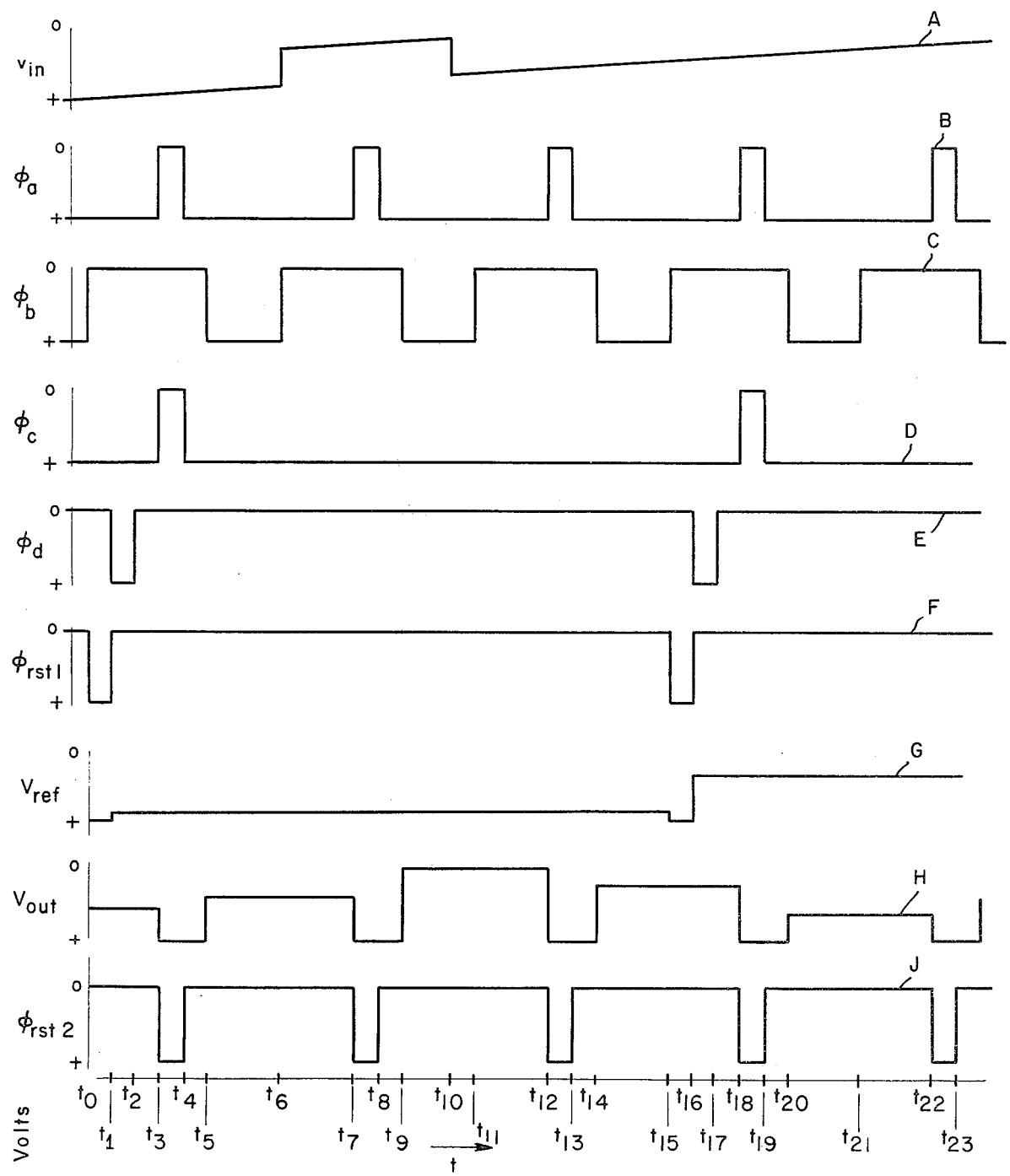
FIGS. 5 and 5a are waveform diagrams showing the various clock, reference, output and input voltages at various portions of the CCD device.

Gate electrode 33 is embedded in film 32 and is connected to external input signal $v_{in}$, which is typified by waveform A as shown in FIG. 5, $v_{in}$ giving rise to barrier 106 at potential level 108.

Electrode 34 is adjacent to electrode 33, embedded in film 32 and is connected to and fed by a DC voltage $V_1$ from source 60, which voltage $V_1$ gives rise to potential well 116 at level 120.

Electrode 35, which is adjacent to electrode 34, is embedded in film 32 and is connected to a source of clock voltage $\phi_d$ from power source 60. Said power source provides clocking waveform E, shown in FIG. 5, to electrode 35 giving rise to potential level 126 when waveform E is at a zero voltage level, and giving rise to level 128 when waveform E is at a positive voltage level, therefore creating barrier 124.

Gate electrode 36 is adjacent to gate electrode 35 and is embedded in film 32 and connected to and fed by DC voltage $V_5$ from source 60 giving rise to surface potential 136 of a charge in sense area 134. Diffusion 15 senses surface potential 138 of the charge in area 134.

Gate electrode 37 is adjacent to electrode 36 and is embedded in film 32 and is powered by $\phi_{rst1}$ of power source 60. The voltage waveform F constitutes $\phi_{rst1}$, and consists of a series of rectangular pulses which provide a reset function to device 10, giving rise to surface potential barrier 140 at level 142 when $\phi_{rst1}$ is at zero voltage and to surface potential level 48 when $\phi_{rst1}$ is at a positive voltage level.

Gate electrode 38 is adjacent to diffusion 17 and is embedded in film 32 and connected to and fed by voltage source $v_{in}$, which gives rise to surface potential barrier 206 at level 208.

Gate electrode 39 is adjacent to gate electrode 38 and is embedded in film 32 and connected to and fed by DC voltage $V_2$ from source 60, giving rise to potential well 224 at level 226.

Gate electrode 40 is adjacent to gate electrode 39 and is embedded in film 32 and connected to and fed by diffusion 15 giving rise to well 216 at level 220.

Gate electrode 41 is adjacent to gate electrode 40 and is embedded in film 32 and is connected to a clock voltage $\phi_b$ from power source 60. Said power source provides clocking waveform C to such electrode 41 giving rise to potential level 232 when waveform C is at zero volts, and to level 234 when waveform C is at a positive voltage level and therefore creating potential barrier 230.

Adjacent to electrode 41 is diffusion 18 partially embedded within body 12 to provide analog output voltage $V_{out}$ as exemplified by waveform H.

Gate electrode 42 is adjacent to diffusion 18 and is embedded in film 32 and is connected to terminal $\phi_{rst2}$ of power source 60. The voltage at $\phi_{rst2}$ is illustrated by waveform J and consists of a series of rectangular pulses which provide a reset function to device 10. Such voltage $\phi_{rst2}$ gives rise to surface potential barrier 260 at level 262 when $\phi_{rst2}$ is a zero voltage, and to surface potential level 264 when $\phi_{rst2}$ is at a positive voltage level.

Diffusion 19 is adjacent to gate electrode 42 and is partially embedded within body 12 and is connected to and fed by DC voltage $V_{dd2}$ from power source 60 giving rise to potential charge area 270 with a surface potential ($\phi_s$) having level 272 at semiconductor interface 22.

Figure 5A:
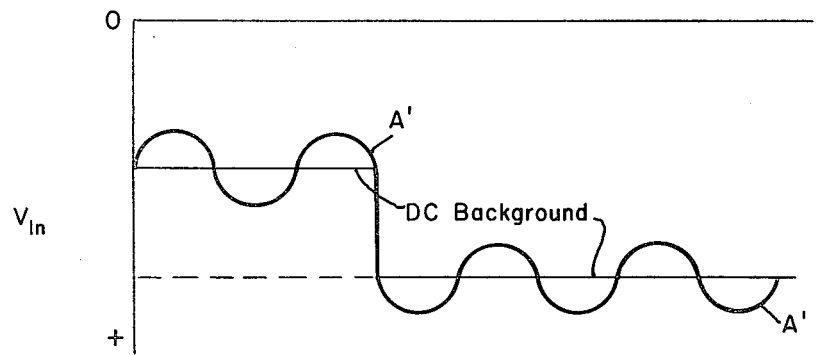
Figure 5A:
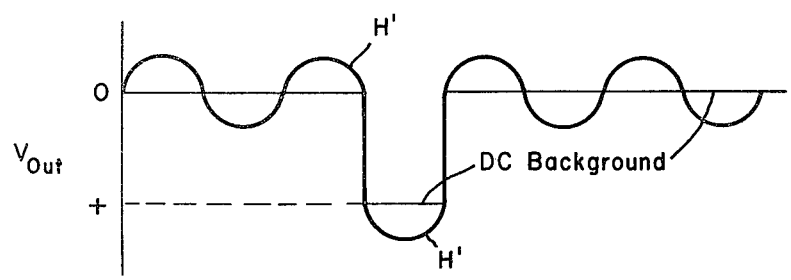
Figure 5A:
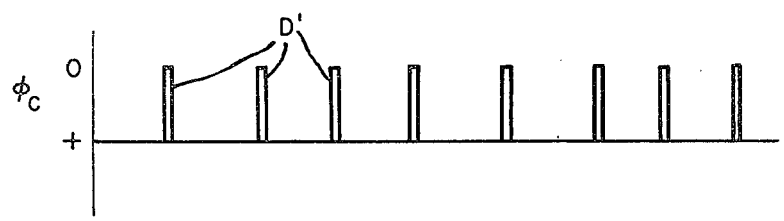
Figure 5A:
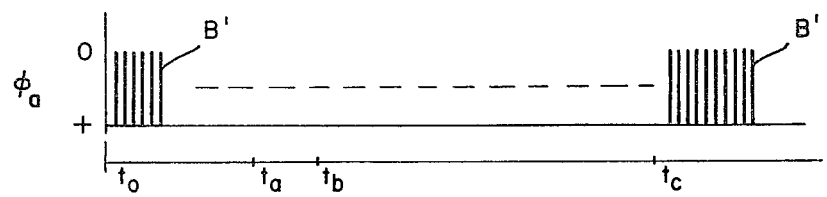

Referring to FIG. 5a, such figure is drawn to a longer time base than FIG. 5, showing some of the principle functions provided by this subtractor in more gross form.

Waveform A' shows that the subtractor input $V_{in}$ accepts an AC signal riding on a DC base. Corresponding clock D' has a lower repetitive rate than clock waveform D in FIG. 5. The clock rate for waveform B' is the same as its rate shown in FIG. 5. The FIG. 5a rate ratio of $\phi_a/\phi_c >> 1$, compared to the same ratio of FIG. 5 waveforms. Accordingly, the subtractor's low frequency response is a function of $\phi_c$, $\phi_d$, $\phi_{rst1}$ as in FIG. 5. Hence, the longer the time duration between $\phi_c$ pulses, the lower the low frequency 3 db. point roll off frequency.

In FIG. 5a, input voltage $v_{in}$ is shown in waveform A' as having an AC signal with a DC off-set, and the output voltage $V_{out}$ is shown as waveform H' being devoid of such input DC component. Consequently, more repetitions of the CCD output of this subtractor is observed by viewing FIG. 5a is compared to FIG. 5.

Figure 6:
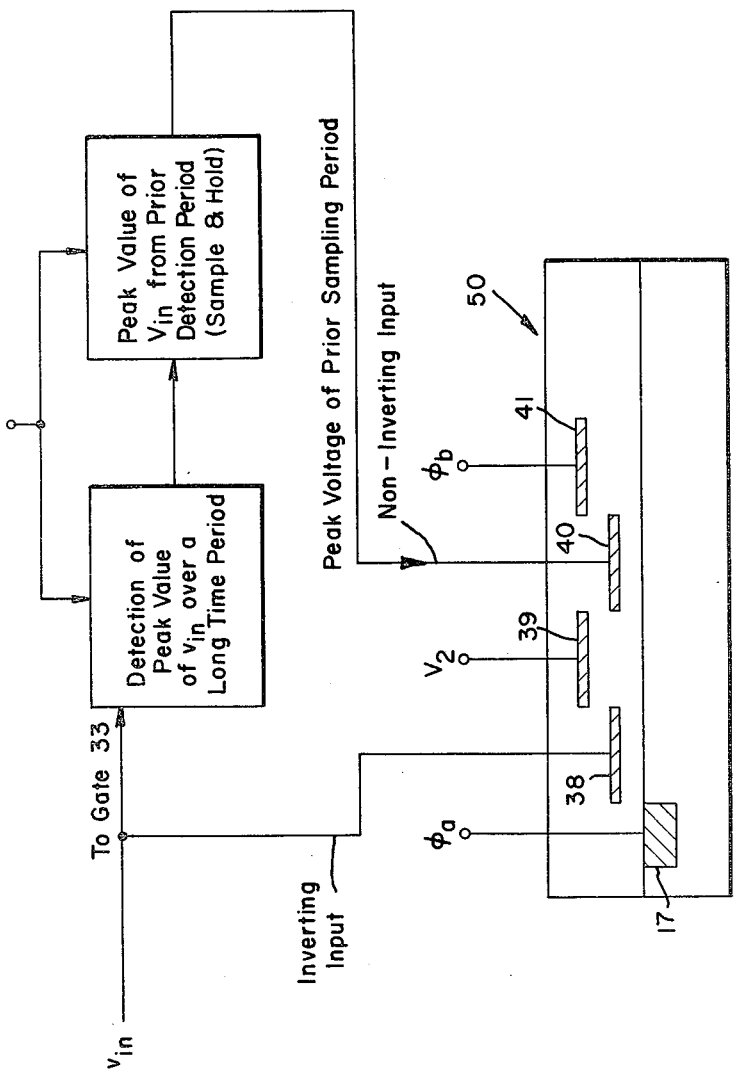
FIGS. 6 and 6a constitute a cross-section view of a portion of the CCD device connected to external circuitry and a potential profile thereof respectively to comprise a functional diagram so as to enable the operation of such device to be better understood.
Figure 6A:
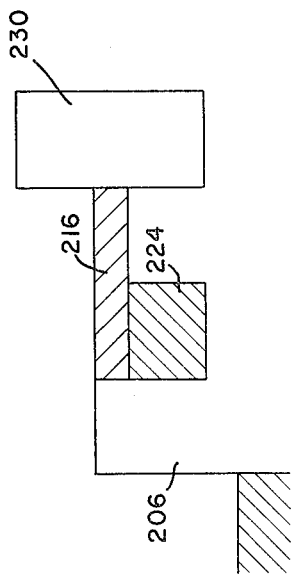

Referring also to FIGS. 6 and 6a, it is to be noted that this background subtractor has inherently embodied a differential amplifier denoted at 50 in FIG. 6. Such differential amplifying function is obtained by virtue a signal $v_{in}$ being applied as an inverting input thereof to input gate 38. The other input to the device for obtaining the differential amplifying function is the non-inverting input $V_{ref}$ fed to input gate 40 from the sample and hold circuit. $V_{ref}$ is created by gates 35, 36 and 37 and the signals applied thereto as well as diffusion 15. Voltage $V_{ref}$ is applied from diffusion 15 to gate 40. When functioning as a background subtractor, this device also rejects the DC component in any signal applied to gates 38 and 40. Thus the DC component does not appear as part of the charge in well 216, and consequently in the output voltage $V_{out}$. Thus the signals applied to gates 38 and 40 modulate the charge in well 216.

The DC component of the input signal is computed by the peak detector and sample and hold circuit during a substantial operating period of the device, and subsequently that peak value is applied as a voltage to gate 40.

At time $t_o$, $\phi_{rst1}$, represented by waveform F, makes a transition from zero to a positive potential, moving barrier 140 from level 142 to level 148 and causing any charge in well 134 to flow to charge area 152 according to charge direction flow arrow 150. Also at time $t_o$, clock $\phi_b$ represented by waveform C makes a transition from a positive potential to zero level, moving barrier 230 from level 234 to level 232.

At time $t_1$, voltage $\phi_{rst1}$, represented by waveform F, makes a transition from a positive to zero potential causing barrier 140 to change from level 148 to level 142 and making well 134 ready to subsequently receive a charge. At such time period, clock voltage $\phi_d$ represented by waveform E, makes a transition from zero to a positive potential, causing barrier 124 to change from level 126 to level 128 and allowing charge in well 116 to flow into well 134 as shown by charge direction flow arrow 132, and providing a potential level 138 of the charge in well 134. This charge is sensed and appears as voltage $V_{ref}$ depicted by waveform G. The charge level is maintained according to waveform G from $t_1$ to $t_{15}$ so that the reference voltage $V_{ref}$ is likewise maintained during that period.

At time $t_2$, as shown by waveform E, clock voltage $\phi_d$ makes a transition from a positive potential to zero, moving barrier 124 from level 128 to level 126. In subsequent excursions of $v_{in}$ and clock voltage $\phi_c$ the charge in well 134 will not be affected until clock voltage $\phi_d$ again makes a transition from zero to a positive potential.

At time $t_3$, clock $\phi_c$ represented by waveform D makes a transition from a positive potential to zero, moving charge in area 100 from level 102 to level 110 and thus allowing a substantial charge quantity to flow over potential barrier 106 into well 116 in direction flow of arrow 112. In a like manner clock voltage $\phi_a$ represented by waveform B makes a transition from a positive to zero potential level, moving charge in area 200 from level 202 to level 210 and thus allowing a substantial quantity of charge to flow over potential barrier 206 into well 216 as shown by direction flow arrow 212. Reset clock voltage $\phi_{rst2}$ represented by waveform J, makes a transition from 0 to a positive potential, moving potential barrier 260 from level 262 to level 264 and allowing charge in well 250 to flow into charge drain area 270 which is maintained at charge level 272. Direction of charge flow is shown by arrow 256. When the charge in well 250 is drained off the charge potential therein will shift to level 254, and $V_{out}$ depicted by waveform H will exhibit a transition from a specific potential level to a more positive potential.

At time $t_4$ clock voltage $\phi_{rst2}$ represented by waveform J, makes a transition from a positive to zero potential moving potential barrier 260 from level 264 to level 262. At the same time clock voltage $\phi_c$ represented by waveform D, makes a transition from zero to a positive potential thereby moving charge in area 100 from level 110 to level 102. Charge flow arrow 114 depicts such charge movement direction. Well 116 is charged to level 118, which level 118 is equal to potential barrier level 108. It should be noted that well 116 will not be drained of charge until several subsequent clock cycles have elapsed. From $t_4$ to such later time, the charge will spill over barrier 106 into area 100, caused by the applied voltage $v_{in}$ as represented by waveform A. Any transition more positive than applied at time $t_4$ will cause charge to spill over from well 116 into area 100 thereby computing the peak signal as denoted in FIG. 6 during such subsequent perturbation of signal $v_{in}$. Also at time $t_4$ clock voltage $\phi_a$ represented by waveform B, makes a transition from zero to a positive potential, moving charge in source area 200 from level 210 to level 202. The charge level in well 216 will be moved to level 218, which is equal to level 208, and excess charge will flow over barrier 206. Charge direction flow arrow 214 denotes charge travel. It should be noted that well 216 and barrier 206, created by voltage $v_{in}$ at gate 38 and barrier 220 created by voltage $V_{ref}$ at gate 40, constitute a differential charge modulator, the functions performed thereby being shown in FIGS. 6 and 6a. The charge thus generated may be observed at device output as a voltage $V_{out}$. The reference signal $V_{ref}$ is a DC voltage generated by diffusion 15 which is connected to gate 40. Diffusion 15 is the means by which the charge in well 134 is sensed. New DC reference voltages are established at time $t_1$ and $t_{16}$. Such new DC reference voltage are maintained until the device is reset. Hence, for example, the new reference voltage that was established at $t_1$ is reset at $t_{15}$. It should be noted that charge in well 134 during times $t_1$ to $t_{15}$ was created by a peak detector comprising gates 33 and 34, well 116 and diffusion 14 during a period previous to $t_1$.

It should be further noted that during period $t_4$ to $t_{16}$ the peak detector circuit computes the peak value of charge to be transferred to sense area 134 at time $t_{16}$. Sense area 134 is also a well for storing charge therein.

At time $t_5$ clock voltage $\phi_B$ represented by waveform C, makes a transition from a zero to positive potential thus moving potential barrier 230 from level 232 to level 234 and allowing the differential signal charge in well 216 to transfer into output sense area 250 as denoted by charge direction flow arrow 240. This charge is now observed as an output voltage $V_{out}$ depicted by waveform H. Like transitions occur at times $t_9$, $t_{14}$ and $t_{20}$.

At time $t_6$ voltage $v_{in}$ is shown to have a less positive going transition. Clock voltage $\phi_b$ as shown in waveform C, makes a transition from a positive to a zero potential, thus moving potential barrier 230 from level 234 to 232. Like transitions also occur at time $t_o$, $t_{11}$, $t_{15}$, $t_{21}$ and at subsequent time periods not shown in FIG. 5.

At time $t_7$ clock reset voltage $\phi_{rst2}$ depicted by waveform J, makes a transition from a zero to a positive potential thereby moving potential barrier 260 from level 262 to level 264 and allowing an output signal to transfer out of output sense area 250 into charge sink area 270 as denoted by charge direction flow arrow 256. This charge transfer causes $V_{out}$ signal as depicted by waveform H, to shift to a more positive potential. It should be noted that this resetting operation occurs at times $t_3$–$t_4$, $t_7$–$t_8$, $t_{12}$–$t_{13}$, $t_{18}$–$t_{19}$ and $t_{22}$–$t_{23}$.

What is claimed is:

1. A CCD background subtractor for processing applied input signals, comprising the combination of:
   first means, including a first charge storage area, for detecting during periodic sampling intervals, the peak value of an applied input signal and for storing a charge indicative thereof in said first charge storage area;

second means, including a second charge storage area, coupled to the first means, for substantially periodically transferring the charge from said first to said second charge storage area, for storing said transferred charge and for converting said transferred charge into a reference voltage; and third means including a third charge storage area, coupled to said second means and fed by the reference voltage and by said applied input signal, for providing a charge in said third storage area which represents the difference between the applied input signal and the peak value of the applied input signal detected during a prior sampling interval.

2. The invention as stated in claim 1, including fourth means, charge coupled to the third means, for transferring the charge out of said third storage area.

3. The invention as stated in claim 1, wherein the first means comprises:
   a first input gate;
   a first gate, charge coupled to the first input gate, for enabling charge to be stored in said first storage area; and
   a first clocked charge source which is part of the first means, charge coupled to the first gate, for providing charge to the first storage area.

4. The invention as stated in claim 2, including a sensing electrode, charge coupled to the fourth means, for monitoring the charge transferred out of the third storage area.

5. The invention as stated in claim 3, wherein the second means comprises:
   a clocked second gate, charge coupled to the first gate, for enabling the transfer of the charge from said first storage area;
   a third gate, charge coupled to the second gate, for storing the charge from said first storage area thereunder;
   a sensing diffusion, charge coupled to the third gate, for providing a voltage proportional to the charge under the third gate;
   a clocked reset gate, charge coupled to the third gate, for enabling the draining of the charge from under said gate; and
   a diffusion, charge coupled to the clocked reset gate, for draining the charges from under said third gate.

6. The invention as stated in claim 4, including a reset gate, charge coupled to the sensing electrode, for enabling the draining of the charge from the sensing electrode.

7. The invention as stated in claim 6, including fifth means, charge coupled to the reset gate, for disposing of the charge drained from the sensing electrode.

* * * * *